(12) United States Patent
Chen et al.

(10) Patent No.: US 6,370,056 B1
(45) Date of Patent: Apr. 9, 2002

(54) FERROELECTRIC MEMORY AND METHOD OF OPERATING SAME

(75) Inventors: Zheng Chen; Vikram Joshi; Myoungho Lim; Carlos A. Paz de Araujo; Larry D. McMillan, all of Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 09/523,492

(22) Filed: Mar. 10, 2000

(51) Int. Cl.[7] ................................................ G11C 11/22

(52) U.S. Cl. .................................. 365/145; 365/185.08

(58) Field of Search .............................. 365/145, 171, 365/185.08; 257/295

(56) References Cited

U.S. PATENT DOCUMENTS

| | | | |
|---|---|---|---|
| 2,876,436 A | 3/1959 | Anderson | 365/145 |
| 4,873,664 A | 10/1989 | Eaton, Jr. | 365/145 |
| 4,888,733 A | 12/1989 | Mobley | 365/145 |
| 5,303,182 A | 4/1994 | Nakao et al. | 365/145 |
| 5,345,414 A * | 9/1994 | Nakamura | 365/145 |
| 5,361,225 A * | 11/1994 | Ozawa | 365/145 |
| 5,365,094 A | 11/1994 | Takasu | 257/295 |
| 5,382,539 A | 1/1995 | Nakamura | 438/3 |
| 5,449,935 A | 9/1995 | Nakamura | 257/295 |
| 5,515,311 A * | 5/1996 | Mihara | 365/145 |
| 5,523,964 A | 6/1996 | McMillan et al. | 365/145 |
| 5,541,871 A | 7/1996 | Nishimura et al. | 365/145 |
| 5,541,873 A | 7/1996 | Nishimura et al. | 365/145 |
| 5,563,081 A | 10/1996 | Ozawa | 438/3 |
| 5,737,261 A * | 4/1998 | Taira | 365/145 |
| 5,768,185 A | 6/1998 | Nakamura et al. | 365/185.01 |
| 5,977,577 A * | 11/1999 | Evans, Jr. | 257/295 |

OTHER PUBLICATIONS

Shu–Yau Wu, "A New Ferroelectric Memory Device, Metal–Ferroelectric–Semiconductor Transistor," IEEE Transactions On Electron Devices, IEEE, vol. 21 (No. 8), p. 499–504 (August, 1974).

S. Y. Wu, "Memory Retention And Switching Behavior Of Metal–Ferroelectric–Semiconductor Transistors," Ferroelectrics, Gordon and Breach Science Publishers Ltd. (Great Britain), p. 379–383 (1976).

Scott et al., "Integrated Ferroelectrics," Condensed Matter News, vol. 1 (No. 3), p. 16–20 (1992).

Auciello et al., "The Physics of Ferroelectric Memories," Physics Today, American Institute of Physics (Woodbury, NY), vol. 51 (No. 7), p. 22–27 (July, 1998).

* cited by examiner

Primary Examiner—David Nelms
Assistant Examiner—M. Tran
(74) Attorney, Agent, or Firm—Patton Boggs LLP

(57) ABSTRACT

A ferroelectric non-volatile memory comprising: a plurality of memory cells, each containing an FeFET and a MOSFET, each of said FeFETs having a source, a drain, a substrate, and a gate, and each MOSFET having a pair of source/drains and a gate. The cells are arranged in an array comprising a plurality of rows and a plurality of columns. A gate line and a bit line are associated with each column, and a word line, a drain line, and a substrate line are associated with each row. One source/drain of each MOSFET is connected to its corresponding gate line; the other source/drain is connected to the gate of the FeFET in the cell. The gate of the MOSFET is connected to its corresponding word line which provides a write and erase enable signal. The drain of the FeFET is connected to its corresponding drain line, and the source of the FeFET is connected to its corresponding bit line. The substrate of each FeFET is connected to its corresponding substrate line. A read MOSFET is connected between a drain input and the drain line associated with each row. The gate of the read MOSFET is connected to an input for the read enable signal.

26 Claims, 5 Drawing Sheets

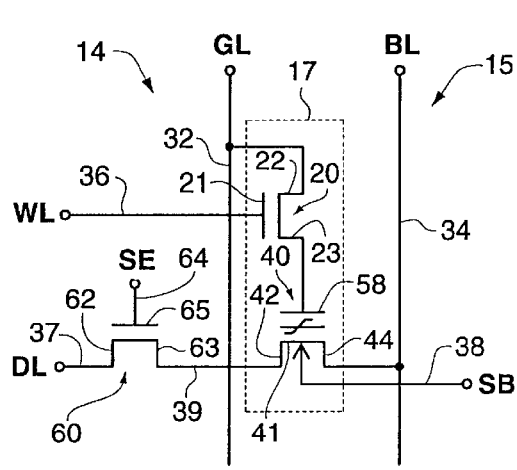
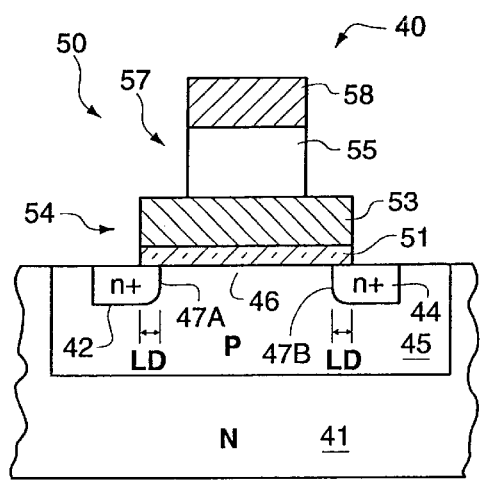
FIG. 1          FIG. 2
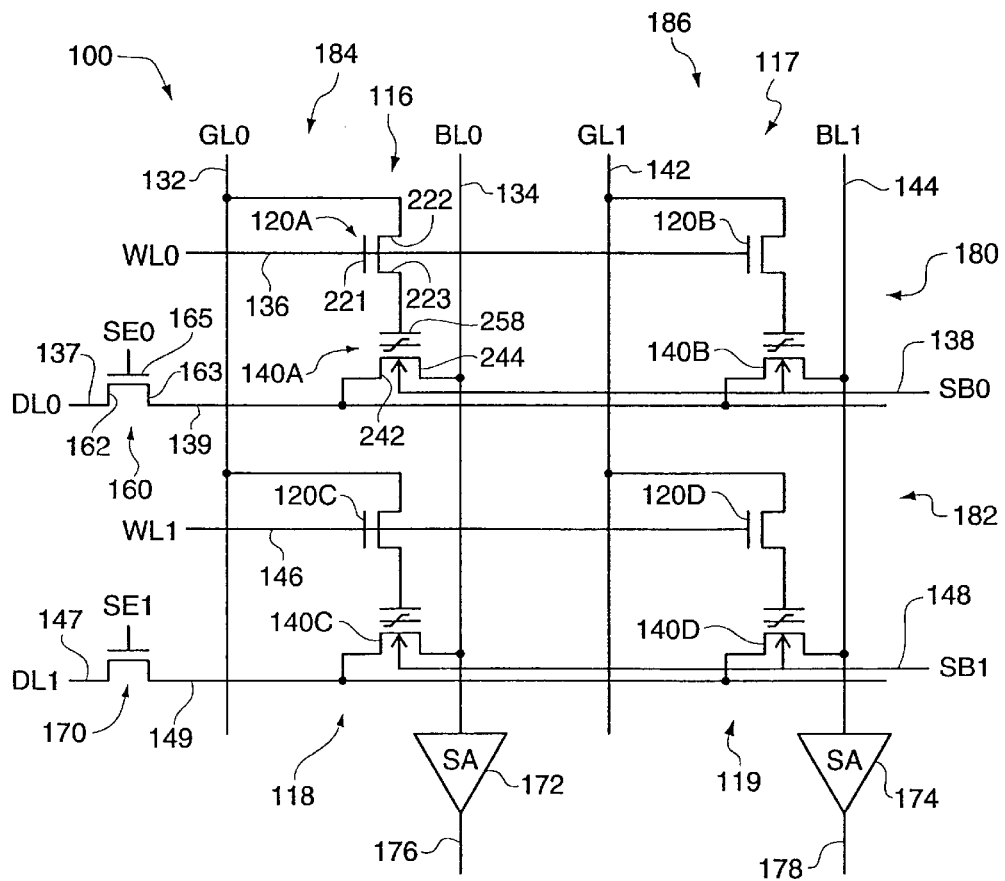
FIG. 3

FERROELECTRIC MEMORY AND METHOD OF OPERATING SAME

BACKGROUND OF THE INVENTION

1. Field of the Invention

This invention relates to ferroelectric memories, and more particularly to such a memory utilizing such ferroelectric field effect transistors and methods of operating such transistors and memories.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function. However, it has been postulated for at least 40 years that it may be possible to design a memory in which the memory element is a ferroelectric field effect transistor (FeFET), which memory could be non-destructively read. See Shu-Yau Wu, "A New Ferroelectric Memory Device, Metal-Ferroelectric-Semiconductor Transistor", *IEEE Transactions On Electron Devices*, pp. 499–504, Aug. 1974; S. Y. Wu, "Memory Retention and Switching Behavior Of Metal-Ferroelectric-Semiconductor Transistors", *Ferroelectrics*, Vol. 11, pp. 379–383, 1976; and J. R. Scott, C. A. Paz De Araujo, and L. D. McMillan, "Integrated Ferroelectrics", *Condensed Matter News*, Vol. 1, No. 3, pp. 15–20, 1992. Because the ferroelectric memory effect measured in the early devices of Wu was only a temporary, single state effect rather than a long-lived two-state effect, it is now believed that this effect was charge injection effect rather than an effect due to ferroelectric switching.

To make a memory requires not only a memory element, but also a means for addressing a large number of memory elements. Initially, it was believed that a ferroelectric memory element might be addressed by a simple array of rows and columns of conductors. A ferroelectric memory element, it was thought, could be located at each of the junctures of the array and addressed by applying a voltage to the conductors for the corresponding row and column. It was believed that if the voltage on each conductor was less than the threshold voltage for ferroelectric switching (coercive voltage) and the voltage difference between the conductors was greater than the coercive voltage, then only the selected cell would be written to or read, and the other cells would remain unchanged. However, it was found that this did not work because the neighboring unselected cells were disturbed by the voltages on the address lines. Thus, a switch was added between one of the address lines and each ferroelectric memory element. See U.S. Pat. No. 2,876,436 issued Mar. 3, 1959 to J. R. Anderson and U.S. Pat. No. 4,873,664 issued Oct. 10, 1989 to S. Sheffield Eaton, Jr. If the switch is a transistor as in the latter patent, the memory assumes a memory address architecture essentially the same as that of a conventional DRAM. However, when applied to a ferroelectric memory, even this architecture disturbed the memory cells attached to the same plate line as the addressed cell. That is, it has been found that ferroelectric materials do not have a sharp coercive threshold voltage, but rather even a small voltage will cause the ferroelectric to partially switch and, therefore, the repetitive application of small disturb voltages, such as occur in a conventional memory array, eventually causes the change or loss of a memory state. Therefore, a more complex architecture was proposed to overcome this disturb. See, for example, U.S. Pat. No. 4,888,733 issued Dec. 19, 1989 to Kenneth J. Mobley.

The above address schemes are all for a NVFRAM; that is, a memory utilizing a ferroelectric capacitor as a memory element, rather than for a memory utilizing an FeFET. A number of address architectures have been disclosed up to now for a memory in which the memory element is an FeFET.

A proposed solution to avoid the disturb problem in memories utilizing ferroelectrics is disclosed in U.S. Pat. No. 5,345,414 issued to Takashi Nakamura on Sep. 6, 1994. This solution utilizes three transistors in each memory cell: in one embodiment, the FeFET, a Metal Oxide Semiconductor field effect transistor (MOSFET) and a Metal Oxide Semiconductor Thin Film Transistor (MOSTFT); in other embodiments the FeFET and two MOSFETS in each cell. This solution is more complex than a DRAM or NVFRAM, not only because it has three electronic elements per cell, but also because in the embodiment with the MOSTFT, it requires a dual power supply, one to supply a positive voltage and one to supply a negative voltage. In the other embodiments, a dual power supply is not needed, but the erase voltage requires a voltage significantly higher than the supply voltage, and in the other, a forward bias between a positively charged substrate and the source is created in the erase function, which results in very high current flow for this function. In addition, two word lines are required in all the embodiments, which adds significant complexity to the architecture. U.S. Pat. No. 5,523,964 issued Jun. 4, 1996 to McMillan et al. discloses a relatively complex addressing architecture, utilizing five transistors in each memory cell in addition to the ferroelectric FET. This complexity is incorporated, like the Mobley et al. architecture, to avoid the disturb problem. All of the foregoing architectures result in a memory that is much less dense and slower than, for example, a conventional DRAM. An architecture that uses one ferroelectric FET per memory cell has been proposed, but has not been implemented because it cannot be read properly if three neighboring cells all are in the conducting logic state. See U.S. Pat. No. 5,449,935 issued to Takashi Nakamura on Sep. 12, 1995, col. 3, line 56–col. 4, line 15. Another such one-FET-per-memory cell design has been proposed in U.S. Pat. No. 5,768,185 issued to Takashi Nakamura and Yuichi Nakao on Jun. 16, 1998. However, during reading, a voltage of 3 volts to 5 volts is applied to the word line while the ground or zero volts is applied to the bit line. While this is not enough to switch the ferroelectric in a single read cycle, as indicated above, it is now known that successive pulses of this magnitude, such as occur in a memory in the normal process of reading, can disturb the ferroelectric state. In addition, since the bit line is connected to the source and substrate and the word line is connected to the gate, if the WLn and BLm+1 signals are not exactly synchronized, the erase process of one cell will disturb the next. Under manufacturing specifications that are practically feasible, such exact synchronization is difficult to achieve in all cells. Therefore, in a commercial product there will be short disturb voltages during the erase cycle also. Further, with this architecture, it is not possible to write a byte at a time, which is a much faster way of reading in a ferroelectric FET.

Thus, the fact that the ferroelectric material does not have a sharp coercive field threshold and can be switched by repetitive applications of a small voltage has made several of the original objectives of research into ferroelectric memories unattainable. In fact, at this writing, for the above reasons, no actual memory based on an FeFET has yet been made. It would, therefore, be highly desirable to provide an architecture and method for addressing a ferroelectric memory, particularly a ferroelectric FET structure and method of making the structure, that was relatively simple and, at the same time, avoided the problems in the prior art, such as the disturb problem.

SUMMARY OF THE INVENTION

The invention solves the above problem by providing ferroelectric memory in which each memory cell preferably contains only two electronic elements, a ferroelectric FET (FeFET) and a switching device, which is preferably a conventional transistor, such as a MOSFET. We shall refer to this cell herein as a 1T/1T memory cell. It is understood that other components can be added to the memory cell that do not essentially change its function as described herein.

The switching device within the cell is preferably operated in the erase and write functions to permit a gate voltage to be applied to the FeFET. When the switching device is a transistor, the transistor gate is coupled to a word line, and its source/drains are connected between a gate line and the FeFET gate.

In the erase function, an erase voltage of Vcc is placed on the substrate of the selected cell, and a zero voltage is placed on the gate line of the selected cell. In the write function, a write voltage of Vcc is placed on the gate line of the selected cell and a zero voltage is placed on the substrate.

As can be seen from the above operation, in distinction from the prior art, only a single power supply is required for this architecture, because all the voltages applied during the erase and write function are of one sign and are not higher than Vcc.

The invention also preferably includes a read switching device, which is also preferably a conventional transistor, such as a MOSFET. The read switching device is not part of the memory cell, and preferably is located in the peripheral circuitry. There is preferably one read switch for each row of cells, and it is operated to connect the one source/drain of the FeFETs in a selected row of cells to a current source during the read function. A current or voltage electronic state of a selected cell is preferably sensed via a bit line connected to the other source/drain of the selected FeFET to determine the logic state of the cell. The voltage of the current source is small, i.e., one volt or less, and preferably only about half a volt.

Preferably, during the erase function, a voltage of Vcc is also placed on the source/drain of the selected cell via the bit line to prevent a forward bias from developing at the substrate-source/drain interface.

Either byte or block erase may be used in operating the memory according to the invention. If block erase is used, there is less than one chance in $10^{11}$ of causing a disturb to a memory cell. Thus, this is the first ferroelectric memory architecture in which there is, in practice, no chance of a disturb happening.
(A summary of the claims will be inserted here after the claims are in final form)

The invention not only provides a simpler and much more dense ferroelectric memory in which the data in cells not being addressed are not disturbed when an addressed cell is written to or read, but also provides one that can be manufactured with state-of-the-art ferroelectric manufacturing processes. Numerous other features, objects and advantages of the invention will become apparent from the following description when read in conjunction with the accompanying drawings.

BRIEF DESCRIPTION OF THE DRAWINGS

FIG. 1 is an electrical circuit diagram showing the essential elements of a memory cell according to the invention and their connection to the signal lines;

FIG. 2 shows a cross-sectional view of a preferred embodiment of a ferroelectric FET according to the invention;

FIG. 3 shows a 2×2 cell array of a memory according to the invention;

DETAILED DESCRIPTION OF THE PREFERRED EMBODIMENT

1. Introduction

Figure 4:
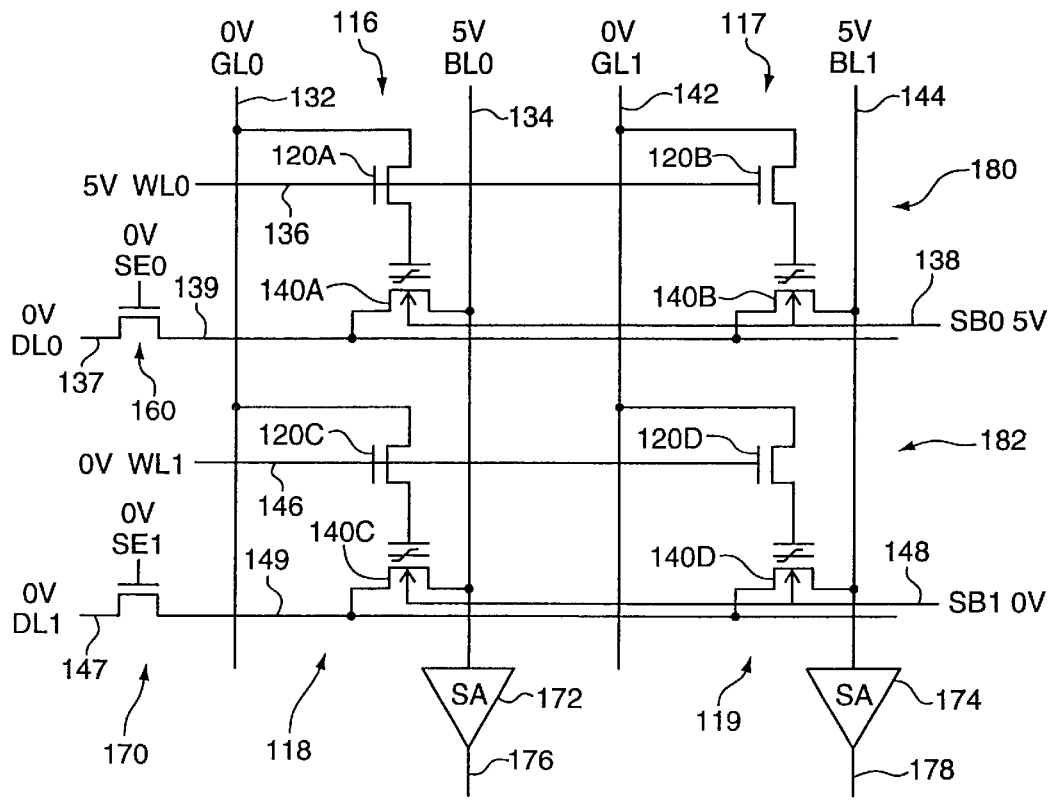
FIG. 4 shows the voltages applied to the array of FIG. 3 during the operation in which a single byte is reset or erased.

Directing attention to FIG. 1, a simplified, one-cell memory 14 according to the invention is shown for illustrative purposes. Memory 14 includes memory array 15, a read transistor 60, a select line 64, and a drain line input 37. Memory array 15 includes a memory cell 17, a gate line 32, a bit line 34, a word line 36, a substrate line 38, and a drain line 39. Memory cell 17 includes an erase/write switching device 20, and a ferroelectric field effect transistor (FeFET) 40. Erase/write switching device 20 may be a diode, a Schottky diode, a pair of back-to-back diodes or other electronic switch, but preferably is a transistor, which we shall refer to herein as an erase/write transistor 20. Transistor 20 is referred to as an "erase/write" switching device to indicate that it functions during the erase and write operations, but does not function during the read operation. Transistor 20 is preferably a conventional transistor such as a MOSFET. Read transistor 60, which is a conventional transistor, and preferably a MOSFET, forms part of the peripheral address circuitry and is not part of memory cell 17. Word line 36 is connected to gate 21 of write transistor 20. Gate line 32 is connected to one source/drain 22 of transistor 20 and the other source/drain 23 is connected to gate 58 of FeFET 40. One source/drain 42 of FeFET 40 is connected to one source/drain of transistor 60. The other source/drain 44 of FeFET 40 is connected to bit line 34. The other source/drain 62 of transistor 60 is connected to the drain line input 37. Select line 64 is connected to gate 65 of transistor 60.

In the operation of memory 14, which shall be discussed in detail below, a signal WL is applied to word line 36, a signal GL is applied to gate line 32, a signal BL is applied to and/or generated on bit line 34, a signal SB is applied to gate source line 38, a signal DL is applied to drain line input 37, and a signal SE is applied to select line 64.

Turning to FIG. 2, a cross-sectional view of a ferroelectric FET (FeFET) 40 that may be used in the memory according to the invention is shown. FeFET 40 is conventionally known as a metal-ferroelectric-metal-insulator-semiconductor (MFMIS) field effect transistor (FET). Another common FeFET that may be used is a metal-ferroelectric-insulator-semiconductor FeFET (MFISFET). Many other types of FeFETs may be used. FeFET 40 includes a substrate 41 which is preferably n-type silicon, but may be p-type silicon or any other appropriate semiconductor, such as gallium arsenide, silicon germanium, and others. A well 45, preferably a p-type well, is formed within substrate 41. Doped active areas 42 and 44, preferably n-type, are formed in well 45. We shall generally refer to these active areas 42 and 44 herein as source/drains since they can either be a source or a drain depending on the relative voltages applied to the areas. In certain portions of this disclosure, the voltages applied to these areas indicate that one is a source and the other is a drain; in these portions, we will then refer to them specifically as either a source or a drain. A channel region 46, preferably also n-type, but not as highly doped as source/drains 42 and 44, is formed between source/drains 42 and 44. A gate structure 50 is formed on substrate 41 above channel region 46. In the preferred embodiment, gate structure 50 is a mutilayer structure, though it may not include all the layers 51 through 58 shown in FIG. 1, and may include additional layers as known in the art. That is, gate structure 50 shown in FIG. 1 is intended to illustrate the layers that could be included in the structure. The fundamental layers involved are an insulating layer 51, a floating gate layer 53, a ferroelectric layer 55, and a gate electrode layer 58. Insulating layer 51, often referred to as the "gate oxide", may be a multilayer structure, each layer of which is a different insulator. It may include an insulator closely related to the material of semiconductor 41, a buffer layer that can perform one or both of two functions: assisting in the adhesion of the layers above it to the layer below it; and preventing the migration of elements in the layers above it to the layers below it, and another material having dielectric properties suitable for effective operation of the FeFET. See, for example, U.S. patent application Ser. No. 09/385,308 filed Aug. 30, 1999, which is incorporated herein by reference as though fully disclosed herein. A floating conducting gate 53 is formed on insulating layer 51. Again, the floating gate may include multiple layers. A ferroelectric layer 55 is formed on floating gate 52. A gate electrode 58 is formed on ferroelectric layer 55. It should be understood that ferroelectric layer 55 and gate electrode 58 can also be multilayer structures, though generally they are not. Wiring layers (see FIG. 8) form electrical contacts to source/drains 42, 44, gate electrode 58, and P-well 45. As shown in the drawing, in the preferred embodiment, the area of the capacitive element 54 comprising floating gate 53 and gate insulator 51 is greater than the area of the capacitive element 54 comprising ferroelectric layer 55 and gate electrode 58 to enhance the voltage drop across ferroelectric 55. See U.S. patent application Ser. No. 09/329,670 filed Jun. 10, 1999, and U.S. patent application Ser. No. 09/365,628 filed Aug. 2, 1999, which are both hereby incorporated by reference as though fully disclosed herein.

Preferably, when semiconductor 41 is silicon, insulating layer 51 is silicon dioxide. Preferably, it may also comprise $CeO_2$, $Ta_2O_5$, $SiO_2$, $ZrO_2$, $Y_2O_3$, $YMnO_2$, and $SrTa_2O_6$. In the preferred embodiment, ferroelectric 57 is a layered superlattice material, such as described in U.S. Pat. No. 5,519,234 issued May 21, 1996 to Paz de Araujo et al.; U.S. Pat. No. 5,434,102 issued Jul. 18, 1995 to Watanabe et al.; U.S. Pat. No. 5,784,310 issued Jul. 22, 1998 to Cuchiaro et al.; and U.S. Pat. No. 5,840,110 issued Nov. 24, 1998 to Azuma et al., all of which are incorporated herein by reference as though fully disclosed herein. However, it may also be any other suitable ferroelectric material, such as an $ABO_3$-type perovskite. Floating gate 53 and gate 58 are preferably made of platinum, though they may be polysilicon or any other suitable conductor. As known in the art, floating gate 53, which is sometimes referred to in the art as the bottom electrode, may be a multilayer structure which may include an adhesive layer depending on the embodiment. The adhesion layer is typically titanium and preferably approximately 20 nm thick. The layer above the adhesion layer is preferably an approximately 100–200 nm thick, layer of platinum. Floating gate 53 may also include a barrier layer, which typically is $IrO_2$, preferably about 4 nm to 40 nm thick. The only essential parts of FET 40 are semiconductor 41, ferroelectric layer 55 and gate 58. The other layers are optional. One or more may be omitted in any specific embodiment. Further, the order of layers 51–58 may be varied, and additional layers may be added.

Figure 8:
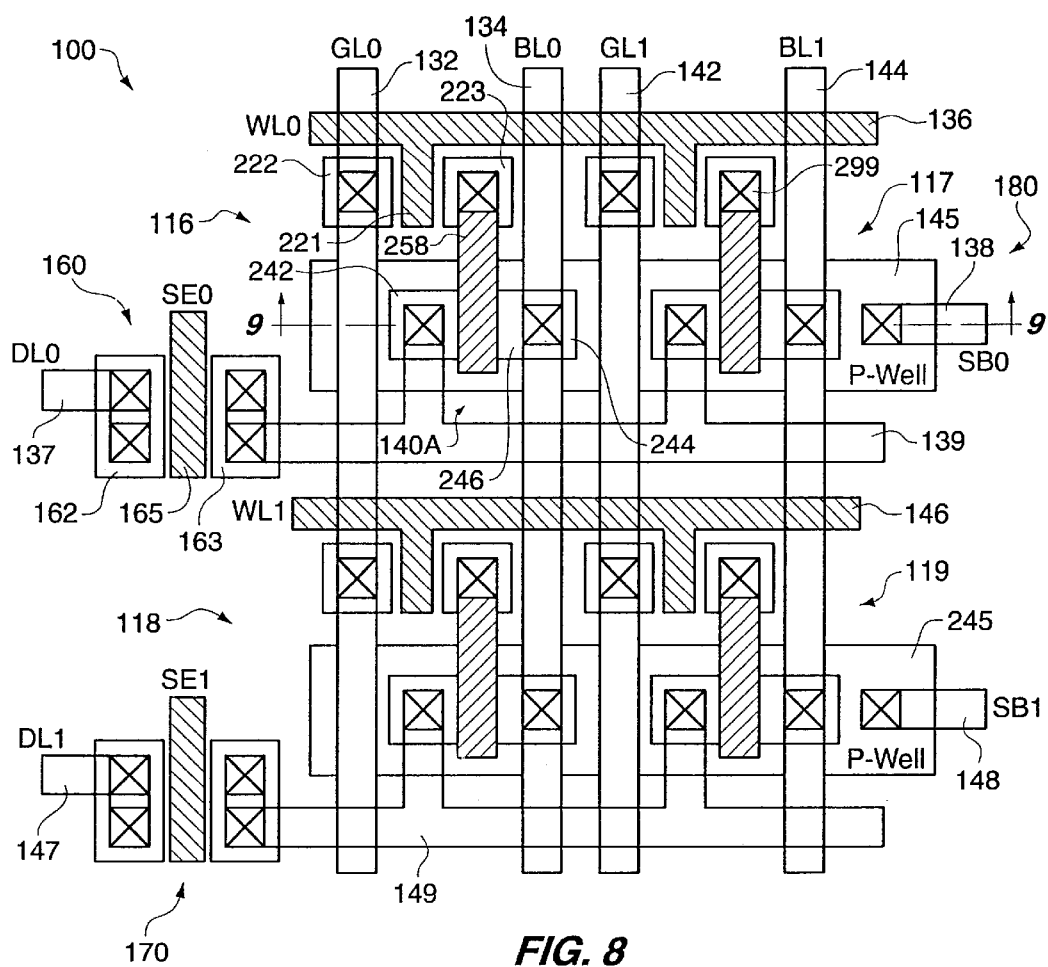
FIG. 8 illustrates the preferred layout of a 2×2 array.
Figure 9:
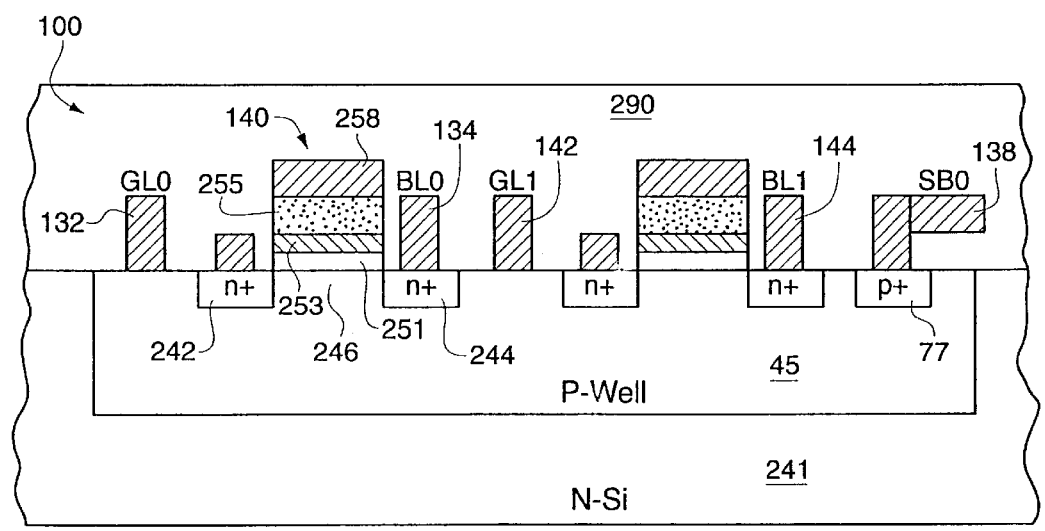
FIG. 9 is a cross-section taken through the lines 9—9 of FIG. 8.

It should be understood that FIGS. 2, 8 and 9 depicting integrated circuit devices are not meant to be actual plan or cross-sectional views of any particular portion of an actual integrated circuit device. In the actual devices, the layers will not be as regular and the thicknesses will generally have different proportions. The figures instead show idealized representations which are employed to more clearly and fully depict the structure and process of the invention than would otherwise be possible. For example, if the various thicknesses of the layers were correct relative to one another, the drawing of the FeFET could not fit on the paper.

Terms of orientation herein, such as "above", "over", "top", "upper", "below", "bottom" and "lower", mean relative to semiconductor substrate 41 That is, if a econd element is "above" a first element, it means it is farther from substrate 41, and if it is "below" another element then it is closer to substrate 41 than the other element. The long dimension of substrate 41 defines a substrate plane that is defined by the horizontal direction and the direction into and out of the paper in FIG. 2. Planes parallel to this plane are called a "horizontal" plane herein, and directions perpendicular to this plane are considered to be "vertical". A memory cell typically comprises relatively flat thin film layers. The terms "lateral" or "laterally" refer to the direction of the flat plane of the thin film layers. In FIG. 2, the lateral direction would be the horizontal direction. The terms "underlie" and "overlie" are also defined in terms of substrate 41. That is, if a first element underlies a second overlying element, it means that a line perpendicular to the substrate plane that passes through the first element also passes through the second element. The term "between" does not mean that the buffer layer is in direct contact with the thin film of ferroelectric material or the semiconductor. The layer "between" other layers may contact the layers it is between, but typically, it does not. The term "on" is sometimes used in the specification when referring to the deposition or formation of an integrated circuit layer onto an underlying substrate or layer. In contrast to "between", the term "on" generally signifies direct contact, as is clear in the various contexts in which it is used.

In this disclosure, the terms "row" and "column" are relative terms that are used to facilitate the disclosure. That is, conventionally, a row is a horizontal line or alignment and a column is a vertical line or alignment. However, the invention contemplates that in any array, rows can become columns and columns can become rows simply by viewing the array from a perspective that is rotated by 90 degrees, 270 degrees, etc. Thus, because a memory architecture is rotated by 90 degrees, 270 degrees, etc., from the invention described in the summary of the invention, the specification, or claims herein, but otherwise is the same, does not take it outside of the architectures contemplated by the invention.

Turning to FIG. 3, a 2×2 memory array 100 including four memory cells 116, 117, 118, and 119 is shown. A layout of this memory array 100 is shown in FIG. 8, and a cross-sectional view through line 9—9 is shown in FIG. 9. Each memory cell is identical in architecture to the memory cell 17 discussed above, including a conventional transistor, such as 120A, and a ferroelectric FET (FeFET), such as 140A. 2×2 array is shown because it is the simplest array with which all of the possible effects on neighboring cells when a cell is erased, written to, or read can be shown. However, an actual memory array will be much larger, including perhaps a thousand rows and a thousand columns. As is conventional in the art, each cell in the memory holds one bit of data, and all the cells in a row hold a byte of data. In array 100, there are two bits to a byte. The memory 100 has two rows of cells, i.e., bytes 180 and 182, and two columns of cells, i.e., columns 184 and 185. Array 100 includes two gate lines 132 and 142, two bit lines, 134 and 144, two word lines, 136 and 146, two drain inputs, 137 and 147, two drain lines 139 and 149, and two substrate lines, 138 and 148. The drain inputs 137 and 147 represent a source of a current. Word line 136 is connected to the gate, such as 221, of each write transistor in byte 180, and similarly word line 146 is connected to the gate of each write transistor in byte 182. Gate line 132 is connected to one source/drain, such as 222, of each write transistor, such as 120A, in column 184, while gate line 142 is similarly connected to one source/drain of each write transistor in column 186. In each memory cell, the other source drain, such as 223, of the write transistor is connected to the gate, such as 258, or the FeFET, such as 140A. Bit line 134 is connected to one source/drain, such as 244, of each FeFET in column 184, while bit line 144 is connected to one source/drain of each FeFET in column 186. Drain line 139 is connected to the other source/drain, such as 242, or each FeFET in row 180, while drain line 149 is connected to each of the other source/drains of each FeFET in row 182. Substrate line 138 is connected to the substrate such as 241 (FIG. 9) of each of the FeFETs in row 180, while substrate line 148 is connected to the substrate of each of the FeFETs in row 182. The gate line signal GL0 is applied to gate line 132 and the gate line signal GL1 is applied to gate line 142. The bit line signal BL0 is applied to bit line 134 and the bit line signal BL1 is applied to gate line 144. The substrate signal SB0 is applied to substrate line 138, while the substrate signal SB1 is applied to substrate line 148. Reading transistor 160, preferably a MOSFET, is connected between drain line input 137 and drain line 139. The read enable signal for the row or byte 180, SE0, is applied to gate 165 of transistor 160. The drain signal, DL0 is applied to one source-drain of read transistor 160, while the other source drain 163 is connected to drain line 139. Read transistor 170, also preferably a MOSFET, is connected between drain line input 147 and drain line 149. The read enable signal for the row or byte 182, SE1, is applied to the gate of transistor 170. The drain signal, DL1 is applied to one source/drain of read transistor 170, while the other source/drain is connected to drain line 149. Sense amplifier 172 is connected to bit line 134 and provides output data on line 176, while sense amplifier 174 is connected to bit line 144 and provides output data on line 178.

The operation of a memory according to the invention will be described in conjunction with FIGS. 4–7 and Truth Tables 1–4. Before writing data to a cell, the cell should preferably be erased, which, with the conventions selected, is the same as resetting to a logic "0". FIG. 4 shows the values of the GL0, GL1, BL0, BL1, WL0, WL1, SE0, SE1, SB0, SB1, DL0, and DL1 signals required to reset byte 180 to a logic "0", that is, to erase the data in cells 116 and 117. WL0 is set at 5 volts (V) which turns the write transistors 120A and 120B on. This permits the 0V PLO and GL1 signals to pass to the gates of FeFETs 140A and 140B. SB0 is set at 5 volts. With the substrate at 5 volts and the gate at 0 volts, the ferroelectric will be polarized such that a logic "0" will be written into cells 116 and 117. With SE0 and SE1 at zero volts, transistors 160 and 170 will be off, and it does not matter what the DL0 and DL1 signals are, though preferably they will be at zero volts. BL0 is set to 5 volts also to prevent the PN junction at the interface (see 47B in FIG. 2) of the source and channels of FeFETs 140A and 140B, such as at the interface of source 244 and channel 246, from becoming forward-biased. WL1, SE1, and SB1 are all set to 0V so that in cells 118 and 119 every electronic element is at zero volts, except for the drains of the FeFETs 140C and 140D. Since the PN junction at the channel-source interface is reversed biased, the voltage in the channel will be close to the substrate voltage, i.e. zero volts. Since the gate is floating, this will not cause a disturb. This is particularly true if the lateral diffusion length, shown as LD in FIG. 2, is small. In state-of-the-art FeFET processing, LD generally is minimal or even zero, so there will be no disturb. Use of the design of FIG. 2 in which the ferroelectric is well removed from the active areas, further ensures that there will be no chance of a disturb occurring.

Summarizing the above, the signals required to reset any cell to a logic "0" are shown in Truth Table 1. All other signals will be zero volts. Thus, as seen above, only the selected cells will be reset to a logic "0", and the non-selected cells will not be disturbed.

As can be seen from FIG. 4, block reset or block erase is also available with the architecture according to the invention. That is, any byte for which WL is set to 5 volts, will be reset. If block reset is intended to be used, all of the FeFETs can be fabricated in the same well so that their substrates are connected. That is, in terms of FIG. 3, substrate lines 138 and 148 are connected. This operation mode is useful for applications in which the FeFET memory is intended to replace flash memory.

Truth Table 1

RESET CELL TO LOGIC "0"

| Signal | Voltage |
|--------|---------|
| WL | 5 V |
| GL | 0 V |
| SB | 5 V |
| SE | 0 V |
| BL | 5 V |
| DL | Don't Care |

Figure 5:
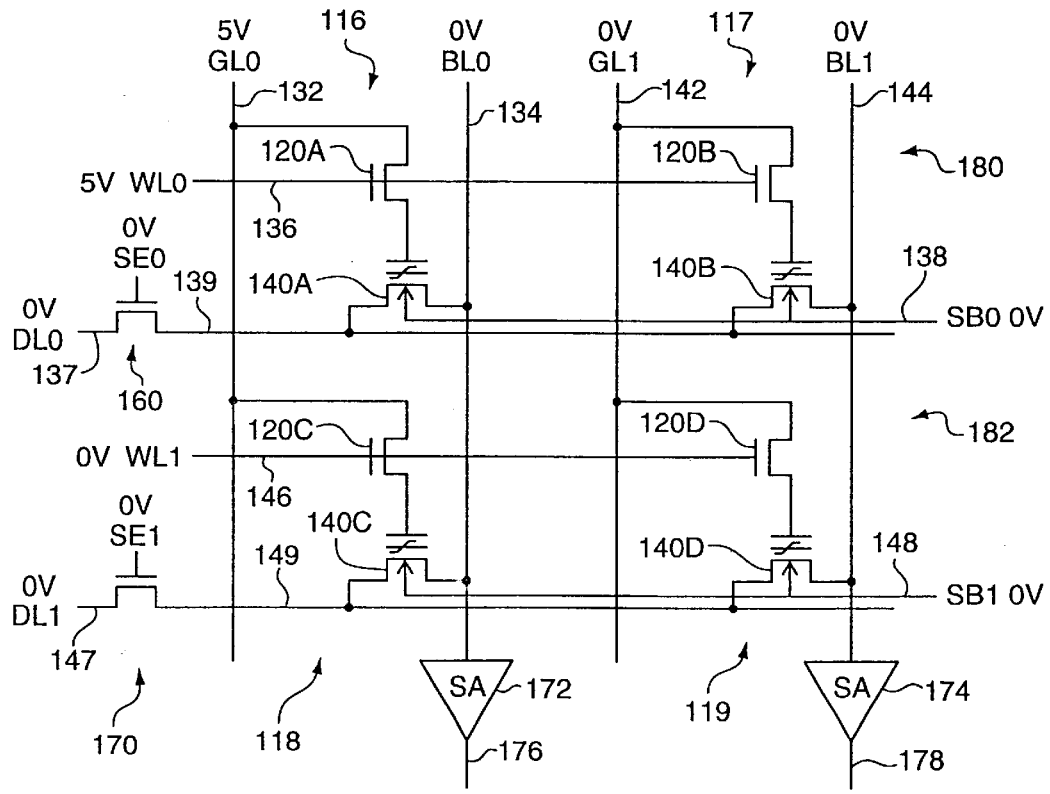
FIG. 5 shows the voltages applied to the array of FIG. 3 during the operation in which a single byte is written.

FIG. 5 shows the values of the GL0, GL1, BL0, BL1, WL0, WL1, SE0, SE1, SB0, SB1, DL0, and DL1 signals required to write byte 180 to "10", that is, to write a logic "1" to cell 116 and a logic "0" to cell 117. WL0 is set at 5 volts (V) which turns write transistors 120A and 120B on, which permits the 5V PLO and 0V GL1 signals to pass to the gates of FeFETs 140A and 140B, respectively. All the other signals are set at zero volts. With the substrate at zero volts and the gate at 5 volts, the ferroelectric of cell 116 will be polarized such that a logic "1" will be written into the cell. With SE0 and SE1 at zero volts, transistors 160 and 170 will be off, and it does not matter what the DL0 and DL1 signals are, though preferably they will be at zero volts. Thus, for cells 117, 118, and 119, every electronic element is at zero volts, and these cells will not be disturbed. Since cell 117 is not disturbed, it remains at the logic "0" to which it was reset in the erase operation described above.

Summarizing the above, the signals required to write any cell to a logic "1" are shown in Truth Table 2. All other signals will be zero volts. Thus, as seen above, only the selected cells will be written to a logic "1".

Truth Table 2

WRITE CELL TO LOGIC "1"

| Signal | Voltage |
| --- | --- |
| WL | 5 V |
| GL | 5 V |
| SB | 0 V |
| SE | 0 V |
| BL | 0 V |
| DL | Don't Care |

Figure 6:
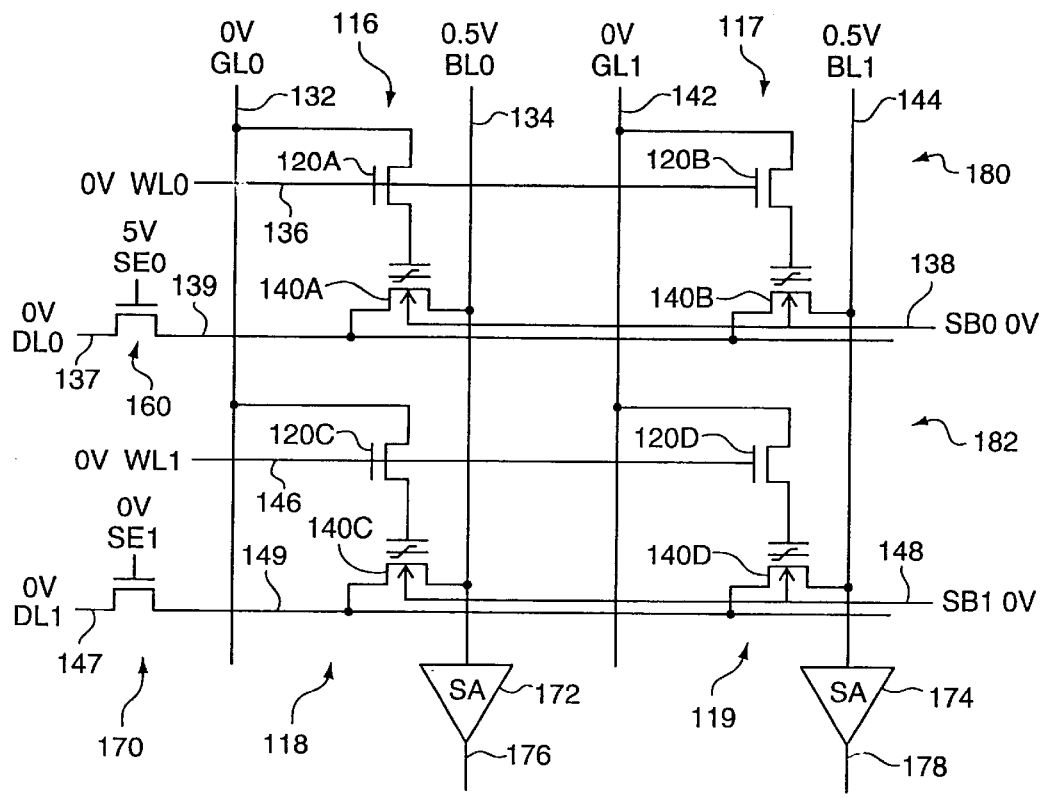
FIG. 6 shows the voltages applied to the array of FIG. 3 during the operation in which a read of a single byte is performed.

FIG. 6 shows the values of the GL0, GL1, BL0, BL1, WL0, WL1, SE0, SE1, SB0, SB1, DL0, and DL1 signals required to read byte 180 in a first embodiment of the read function. WL0 and WL1 are set at zero volts, which turns write transistors 120A through 120D off. SE0 is set to 5 V, which turns transistor 160 on, while SE1 is set to zero volts, which keeps transistor 170 off. DL0 is set to zero volts. DL1 does not matter, but, preferably, it is also set to zero volts. BL0 and BL1 are preferably initially set to 0.5 volts. All the other signals are set at zero volts. In each cell, both the gate and substrate are at the same voltage, i.e., zero volts, so no cell is disturbed. If, for example, cell 116 is in the logic "1" state, the channel 246 in FeFET 140A will be conducting and current will flow from bit line 134 to the drain, and bit line 134 will fall to ground. Sense amplifier 172 will detect this fall of voltage and output a logic "1" on data line 176. On the other hand, if cell 116 is in the logic "0" state, channel 246 will be non-conducting and bit line 134 will remain at 0.5 volts. Sense amplifier 176 will detect this voltage and output a logic "0" on data line 176. Similarly, sense amplifier 174 will sense the logic state of cell 117 and output the corresponding data on line 178.

In the above read embodiment, the drain input can always be grounded, as shown in FIG. 6, which enables an architecture which reduces the area of the layout even further. It is noted that the bit line corresponding to the cells to be read is placed at a low voltage, such as 0.5 volts, to prevent any disturb to the cells when they are read. Since the PN junction at the channel-source interface is reverse biased, the voltage in the channel will be essentially the substrate voltage, i.e. zero volts. If the lateral diffusion length, shown as LD in FIG. 2, is small, the 0.5 volts on the source will not be sufficient to disturb cells 118 or 119, since the gate is floating, and particularly if the FeFET design of FIG. 2 is used. Simulations have shown that this is true even if the read operation is performed $10^{10}$ times between write operations.

Summarizing the above, the signals required to read any cell in the above embodiment are shown in Truth Table 3. All other signals will be zero volts. Thus, as seen above, only the selected cells will be read, and no cells will be disturbed.

Truth Table 3

READ (first embodiment)

| Signal | Voltage |
| --- | --- |
| WL | 0 V |
| GL | 0 V |
| SB | 0 V |
| SE | 5 V |
| BL | 0.5 V, Sense logic state |
| DL | 0 V |

Figure 7:
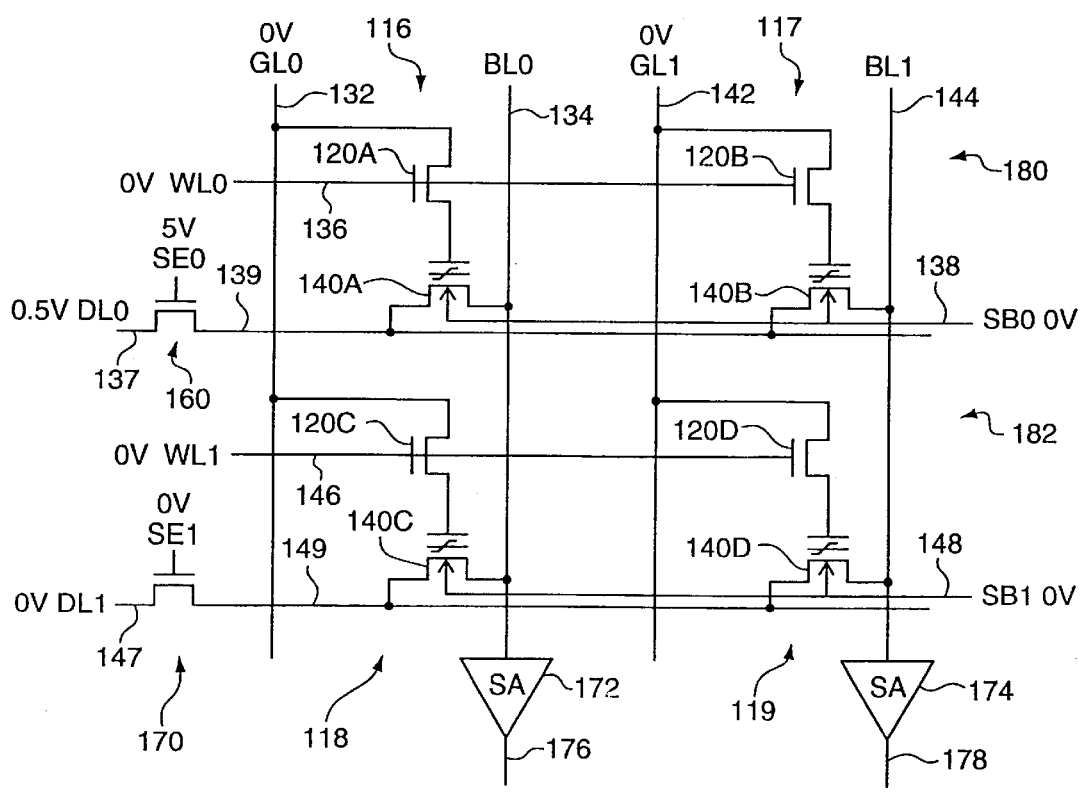
FIG. 7 shows the voltages applied to the array of FIG. 3 during an alternative read operation for a single byte.

FIG. 7 shows the values of the GL0, GL1, BL0, BL1, WL0, WL1, SE0, SE1, SB0, SB1, DL0, and DL1 signals required to read byte 180 in a second embodiment of the read function. WL0 and WL1 are set at zero volts, which turns write transistors 120A through 120D off. SE0 is set to 5 V, which turns transistor 160 on, while SE1 is set to zero volts, which keeps transistor 170 off. DL0 is set to 0.5 volts. DL1 does not matter, but, preferably, it is set to zero volts. BL0 and BL1 are preferably initially set to zero volts. All the other signals are set at zero volts. In each cell, both the gate and substrate are at the same voltage, i.e., zero volts, so no cell is disturbed. If, for example, cell 116 is in the logic "1" state, channel 246 in FeFET 140A will be conducting and current will flow from drain input 137 to bit line 134 and the bit line will rise to near 0.5 volts. Sense amplifier 172 will detect this rise of voltage and output a logic "1" on data line 176. On the other hand, if cell 116 is in the logic "0"state, channel 246 will be non-conducting and bit line 134 will remain at zero volts. Sense amplifier 176 will detect this voltage and output a logic "0" on data line 176. Similarly, sense amplifier 174 will sense the logic state of cell 117 and output the corresponding data on line 178.

In the above read embodiment, the drain input can always be set at 0.5 volts, which may reduce the area of the layout. Similar to the first read embodiment, the rain of the cells to be read is placed at a low voltage, such as 0.5 volts, to prevent any disturb to the cells when they are read. Since the PN junction at the drain-channel interface (see 47A in FIG. 2) is reverse biased, the voltage in the channel will be essentially the substrate voltage, i.e. zero volts. If the lateral diffusion length, shown as LD in FIG. 2, is small, the 0.5 volts on the drain will not be sufficient to disturb cells 118 or 119, since the gate is floating, and particularly if the FeFET design of FIG. 2 is used. Simulations have shown that this is true even if the read operation is performed $10^{10}$ times between write operations.

Summarizing the above, the signals required to read any cell in the above embodiment are shown in Truth Table 4. All other signals will be zero volts. Thus, as seen above, only the selected cells will be read, and no cells will be disturbed.

Truth table 4

READ (second embodiment)

| Signal | Voltage |
| --- | --- |
| WL | 0 V |
| GL | 0 V |
| SB | 0 V |

-continued

Truth table 4
READ (second embodiment)

| Signal | Voltage |
|---|---|
| SE | 5 V |
| BL | 0 V, Sense logic state |
| DL | 0.5 V |

In all of the above embodiments, it should be understood that the voltages WL, GL, BL, DL, SB, and SE can be varied from those given for design convenience for reducing disturb, if necessary. It also should be understood that the logic state can be sensed by a current sense amplifier as well as a voltage sense amplifier. It should also be understood that either n-channel transistors, p-channel transistors, or a combination of the two can be used.

A feature of the invention is that both the memory and its operation are simple. The memory cell is about as simple as a memory cell can be, and does not require a significant amount of peripheral logic to operate. Only one read transistor is required for each byte or row. Transistors are inherently simple and well understood and developed in the art. The voltages used are well within the range of state-of-the-art memories. Sense amplifiers capable of distinguishing the voltages produced are well-known in the art.

A feature of the invention is that the 1T/1T architecture leads to a very dense memory. This feature can best be understood by considering the layout of the 2×2 array as shown in FIG. 8, together with a cross-section through the array, which cross-section is shown in FIG. 9. The FeFETs 140A–140D of FIGS. 3, 8 and 9 are similar to the FET of FIGS. 1 and 2, except that floating gate 252 and gate insulator 250 have the same area as ferroelectric 255. Parts that correspond in FIGS. 3, 8, and 9 are numbered the same. We shall not repeat the line connections described in the discussion of FIGS. 3, 8, and 9 above. As can be seen in FIGS. 8 and 9, all the FETs in the same byte, such as 180, share the same P-well 145, which increases manufacturing efficiency as well as density. Preferably, the FeFETs, such as 140A–140 D, are n-channel and the MOSFETS, such as 120A–120D, 160 and 170 are p-channel. This permits the cell size to be minimized. Preferably, word lines, such as 136 and 146, and select lines, such as 165, are made of polysilicon, and are deposited and patterned at the same time. Preferably, drain lines, such as 135, as well as drain input, such as 137, and substrate lines, such as 138, are aluminum. In the preferred embodiment, the substrate line simply comprises a connection to the P-well of the byte or row. As shown in FIG. 9, a dielectric capping layer 290, preferably made of silicon glass or other material with a suitable high breakdown voltage, covers the various electrical connectors and wiring layers and insulates them from one another. The X's in a square, such as 299 in FIG. 8, represent feed-throughs that provide the required connections between wiring layers at different levels (not all of which are shown). The density of the layout shown in FIGS. 8 and 9 is higher than a NVFRAM since the extra transistor in each cell takes up less space than the capacitor of the NVFRAM. With current state-of-the-art ferroelectric technology, the density of the above layout is about the same as that of a DRAM. In principal, the density of the 1T/1T memory described herein can surpass that of the DRAM, because a conventional MOSFET, such as 120A, in principal, can be made smaller than a conventional DRAM capacitor.

An important feature of the invention is that the opportunity for disturb of the data in cells is dramatically reduced. If block erase of the entire memory is used, there is no realistic chance of disturb. The only time when a voltage other than an erase or write voltage is placed across the ferroelectric material is during the read cycle. This voltage is very small and is reduced further by the fact that it is placed only on the source of the FeFET, or only on the drain, the gate is floating at the time the voltage exists, and a reverse bias exists between the channel and source/drain that holds the voltage. Present-day ferroelectric materials, such as layered superlattice materials, will disturb about every thousand cycles if 0.4 volts is placed across the ferroelectric. However, the chances of disturb fall off dramatically as the voltage is decreased below 0.4 volts. At a 0.2 volt voltage across a ferroelectric, there will be no disturb even after $10^{10}$ to $10^{11}$ cycles. SPICE simulations of the memory according to the invention show that the voltage across the ferroelectric under the read conditions described above will be even less than 0.2 volts. Thus, the memory according to the invention is, for all practical purposes, disturb free.

Another important feature of the invention is that the memory operates well with much lower ferroelectric polarizabilities than a NVFRAM and other FeFET memories. NVFRAMs require a polarizability of at least 7 microcoulombs/centimeter squared ($\mu C/cm^2$) for a practical working memory. However, a smaller polarizability will result in a more highly saturated polarization in the ferroelectric at a given polarizing field. The higher saturation results in longer retention times. It has been found that the readout current decreases from 420 microamperes to 340 microamperes when the polarization decreases from 8 $\mu C/cm^2$ to 2 $\mu C/cm^2$. This is a relatively small decrease in readout current for a large increase in saturation. 340 microamperes is large enough to be read reliably by state-of-the-art current sense amplifiers. In addition, materials with smaller polarizabilities also often have smaller dielectric constants. Since a ferroelectric FET is essentially a pair of capacitors 57 and 54 in series, the smaller the dielectric constant of a ferroelectric, the larger the voltage that drops across the ferroelectric capacitor 57 for a given FeFET design. Thus, the use of materials with smaller polarizabilities also leads to better switching of the ferroelectric for this reason also.

Another feature of the invention is that only a single power supply is needed to write both a logic "0" and a logic "1". In many, if not most, prior art FeFET architectures, both positive and negative voltages are required to write both logic "0" and logic "1". In other designs, a higher voltage is required to write one logic state than the other logic state. In the memory according to the invention, the same low positive voltage is used to write both states. Thus, the power supply area in the peripheral logic required to support the memory is simplified and its area is reduced.

Figure 10:
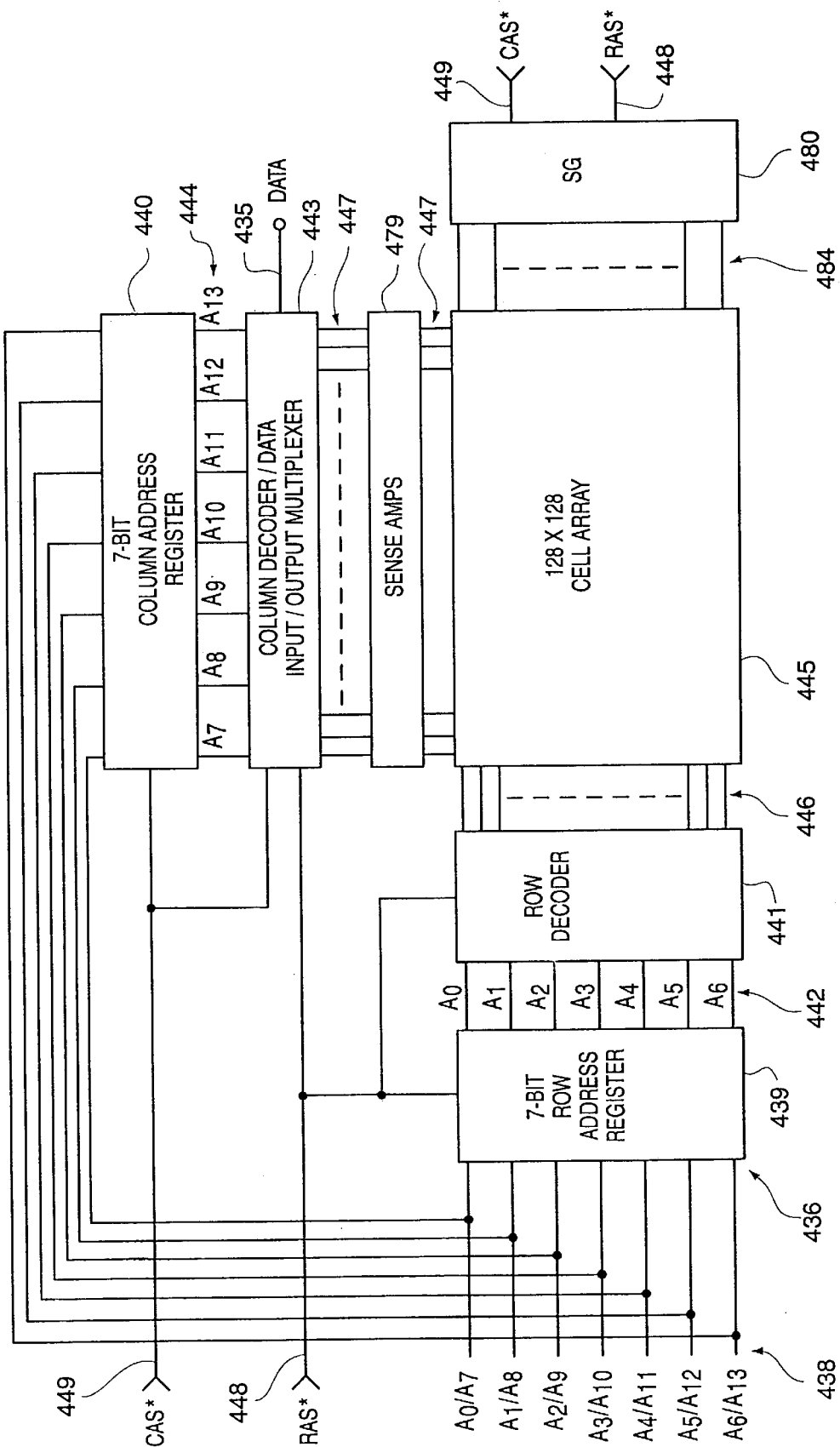
FIG. 10 is an illustration of how an array according to the invention can be incorporated into a non-volatile ferroelectric memory.

FIG. 10 is a block diagram illustrating an exemplary integrated circuit memory 436 in which memory arrays, such as 100, according to the invention are utilized. Memory 436 is presented only to place the various portions of the invention described above within the context of the memory art, and as an illustration of a possible application of the electronics described above. Those skilled in the art will recognize that many other applications are possible. For simplicity, the embodiment shown is for a 16K×1 FeRAM; however, the material may be utilized in a wide variety of sizes and types of memories. In the 16K embodiment shown, there are seven address input lines 438 which connect to a row address register 439 and a column address register 440.

Row address register 439 is connected to row decoder 441 via seven lines 442, and column address register 440 is connected to a column decoder/data input/output multiplexer 443 via seven lines 444. Row decoder 441 is connected to a 128×128 memory cell array 445 via 128 lines 446, and column decoder/data input/output multiplexer 443 is connected to sense amplifiers 479 and memory cell array 445 via 128 lines 447. A signal generator 480 is connected to array 445 via up to 256 lines 484. A RAS* signal line 448 is connected to row address register 439, row decoder 441, column decoder/data input/output multiplexer 443, and signal generator 480, while a CAS* signal line 449 is connected to column address register 440, column decoder/data input/output multiplexer 443, and signal generator 480. (In the discussion herein, a* indicates the inverse of a signal.) An input/output data line 435 is connected to column decoder/data input/output multiplexer 443.

Memory cell array 445 contains 128×128=16,384 memory cells, which is conventionally designated as 16K. These cells are ferroelectric switching capacitor-based cells such as 17. Lines 446 correspond to the word lines, such as 36. Lines 447 correspond to the gate and bit lines, such as 32 and 34.

The operation of the memory in FIG. 14 is as follows. Row address signals $A_0$ through $A_6$ and column address signals $A_7$ through $A_{13}$ placed on lines 438 are multiplexed by address registers 439, 440 utilizing the RAS* and CAS* signals, and passed to row decoder 441 and column decoder/data input/output multiplexer 443, respectively. Row decoder 441 places the word line signals, such as the WLn signals discussed above on the one of the word lines 446 corresponding to the cell that is addressed. Column decoder/data input/output multiplexer 443 either places the data signal which is input on line 435 on the one of the gate lines 447 corresponding to the column address, or outputs on the data line 435 the signal on the one of the bit lines 447 corresponding to the column address, depending on whether the function is a write or read function. These are the gate line signal, PLm, and the bit line signal, BLm, discussed above. As is known in the art, the read function is triggered when the RAS* signal precedes the CAS* signal, and the write function is triggered when the CAS* signal comes before the RAS* signal. As is well-known in the art, sense amplifiers 479 are located along lines 447 to amplify the signals on the lines. The drain and substrate signals, such as DLn and SBn signals discussed above, are produced by signal generator 480 based on the CAS* and RAS* signals and an internal chip clock. In some memories, signal generator 480 and row decoder 441 may be combined into a single signal generation unit. The circuitry of row decoder 441 and signal generator 480 includes all circuitry required to produce the word line, drain line, and substrate signals discussed above. This circuitry is known in the art of integrated circuit memory design, and will not be further discussed herein. Other logic required or useful to carry out the functions outlined above as well as other known memory functions is also included in memory 436 but is not shown or discussed as it is not directly applicable to the invention.

There have been described what are, at present, considered to be the preferred embodiments of the invention. It will be understood that the invention can be embodied in other specific forms without departing from its spirit or essential characteristics. For example, while the invention has been described in terms of a silicon substrate, other substrates, such as gallium arsenide, germanium, silicon germanium, and other substrates may be used. Many other ferroelectric FET structures can be used in combination with the addressing scheme shown, for example, MFISFET structures. Further, now that the possibility and advantages of a 1T/1T ferroelectric memory has been disclosed, many modifications and variations of the principles disclosed may be devised. For example, an architecture using a dummy cell for each active cell, i.e., a 1T/1T×2 architecture may be used. The present embodiments are, therefore, to be considered as illustrative and not restrictive. The scope of the invention is indicated by the appended claims.

We claim:

1. A ferroelectric memory comprising a plurality of memory cells, each memory cell consisting essentially of a ferroelectric FET (FeFET) and an erase/write switching device.

2. A ferroelectric memory as in claim 1 wherein said erase/write switching device is a transistor.

3. A ferroelectric memory as in claim 2 wherein said transistor is a MOSFET.

4. A ferroelectric memory as in claim 2 wherein said FeFET includes an FeFET gate and said memory further includes a gate line, and wherein said transistor is connected between said gate line and said FeFET gate.

5. A ferroelectric memory as in claim 4 wherein said memory cells are arranged in rows and columns; there are a plurality of said gate lines with each gate line coupled to said memory cells along a column; said memory includes a plurality of word lines, each word line coupled to said memory cells along a row; and said transistor includes a transistor gate, said transistor gate in each of said memory cells being connected to said word line.

6. A ferroelectric memory as in claim 5 wherein said transistor includes a first source/drain and a second source/drain, said first source/drain is coupled to said gate line, and said second source/drain is coupled to said FeFET gate.

7. A ferroelectric memory as in claim 1 wherein said FeFET includes an FeFET gate and said memory further includes a gate line, and wherein said switching device is connected between said gate line and said FeFET gate.

8. A ferroelectric memory as in claim 7 wherein said memory cells are arranged in rows and columns, there are a plurality of said gate lines with each gate line coupled to said memory cells along a column, said memory includes a plurality of word lines, and each word line is coupled to operate said switching device in each of said memory cells along a row.

9. A ferroelectric memory as in claim 1 wherein said memory further includes a read transistor for enabling the read function in a plurality of said memory cells.

10. A ferroelectric memory comprising a plurality of memory cells, each memory cell consisting essentially of a ferroelectric FET and a transistor, and said memory further including a read transistor for enabling the read function in a plurality of said memory cells.

11. A ferroelectric memory comprising:
a plurality of memory cells, each said memory cell comprising a ferroelectric FET (FeFET);
a column decoder; and
a read transistor, separate from said column decoder, for enabling the read function in a plurality of said memory cells.

12. A ferroelectric memory as in claim 11 wherein said memory includes a plurality of said read transistors and further includes a current source and a plurality of drain lines, each of said drain lines is coupled to said memory cells along a row, and each of said read transistors is coupled between said current source and one of said drain lines.

13. A ferroelectric memory as in claim 12 wherein each of said FeFETs includes a first source drain and a second source drain, each of said drain lines being connected to said first source/drain of said FeFET in each of said memory cells, and said memory further includes a plurality of bit lines, each said bit line coupled to said second source/drain in said memory cells along a column.

14. A ferroelectric memory as in claim 11 wherein said read transistor is a MOSFET.

15. In a nonvolatile ferroelectric memory of the type having a plurality of memory cells arranged in rows and columns, each column comprising a bit line coupled to memory cells along that column, each row comprising a word line coupled to memory cells along that row, each said memory cell comprising a ferroelectric FET (FeFET) having a gate and a layer of ferroelectric material, the polarization of said ferroelectric material corresponding to the data stored in each said memory cell, the improvement comprising:

said memory further comprising a plurality of gate lines distinct from said bit and word lines, each memory cell being coupled also to a corresponding gate line;

each of said memory cells further including a switching device located within the memory cell, said gate of said FeFET in said cell being coupled to its corresponding gate line via said switching device, said switching device being coupled to be controlled by said corresponding word line; and said memory further including a plurality of substrate lines distinct from said bit lines, word lines, and gate lines, each of said substrate lines coupled to said memory cells along a row.

16. A ferroelectric memory as in claim 15 wherein said memory further comprises a plurality of drain lines distinct from said bit lines, word lines, and gate lines, each of said drain lines coupled to said memory cells along a row.

17. A ferroelectric memory as in claim 16 wherein each of said FeFETs includes a first source/drain, a second source/drain, and a substrate, said memory further includes a plurality of substrate lines distinct from said bit lines, word lines, gate lines, and drain lines, each of said substrate lines coupled to said substrate of said FeFETs in said memory cells along a row, each of said drain lines connected to said first source/drain of said FeFETs and each of said bit lines connected to said second source/drain of said FeFETs.

18. A method of reading a ferroelectric memory, said memory including: a plurality of memory cells arranged in rows and columns; a plurality of bit lines, each of said bit lines associated with a corresponding one of said columns; a plurality of read enable switches, each of said read enable switches corresponding to one of said rows; and a current source; each of said memory cells containing a ferroelectric FET having a first source/drain and a second source/drain; said method comprising:

applying a signal to the one of said read enable switches corresponding to a selected memory cell row to connect each of said first source/drains in a plurality of said memory cells in said row to said current source; and sensing the signal on one of said bit lines corresponding to a selected memory cell to determine the logic state of said selected memory cell.

19. A method of reading a ferroelectric memory as in claim 18 wherein said step of applying results in a voltage of 1 volt or less being applied to said first source/drains.

20. A method of reading a ferroelectric memory including a plurality of memory cells, each of said memory cells containing a ferroelectric FET (FeFET) having a first source/drain and a second source/drain, said method comprising the steps of:

applying a first voltage to said first source/drain of a selected memory cell and a second voltage different from said first voltage to said second source/drain of said selected memory cell, both said first voltage and said second voltage being no more than one volt; and sensing the signal on one of said source/drains to determine the logic state of said selected memory cell.

21. A method of reading a ferroelectric memory as in claim 20 wherein said first voltage and said second voltage are no more than 0.5 volts.

22. A method of reading a ferroelectric memory as in claim 20 wherein each of said FeFETs include a gate and said method includes the step of permitting said gate to electronically float during said step of applying.

23. A method of reading a ferroelectric memory as in claim 20 wherein said FeFET includes a channel between said source/drains, and said step of applying creates a reverse bias at the interface between said channel and said source/drain to which the higher of said voltages is applied.

24. A method of reading a ferroelectric memory as in claim 23 wherein each of said FeFETs include a gate and said method includes the step of permitting said gate to electronically float during said step of applying.

25. A nondestructive method of reading a selected memory cell in a nonvolatile ferroelectric memory, said memory comprising: an array of memory cells arranged in rows and columns, each memory cell including a ferroelectric FET and a switching device located in the cell, said ferroelectric FET having a gate and said switching device connected to said gate of said FET, each of said ferroelectric FETs having a first source/drain and a second source/drain; a plurality of drain lines, each of said drain lines coupled to the memory cells along a row; a plurality of bit lines, each of said bit lines coupled to the memory cells along a column; said method comprising the steps of connecting a current source to the one of said drain lines associated with a selected one of said rows; and sensing a signal on the one of said bit lines corresponding to a selected memory cell in said selected row to determine the logic state of said selected memory cell.

26. A method of reading a ferroelectric memory as in claim 25 wherein said step of connecting comprises applying voltages of no more than 1 volt to said source/drains.

* * * * *